(12) United States Patent
Fu et al.

(10) Patent No.: US 9,680,485 B2
(45) Date of Patent: Jun. 13, 2017

(54) AUTOMATIC FREQUENCY CONTROL

(75) Inventors: Yanzeng Fu, Xi'an Shaanxi Province (CN); Jie Lei, Xi'an Shaanxi Province (CN); Yunshuai Tang, Xi'an Shaanxi Province (CN); Hong Zhang, Xi'an Shaanxi Province (CN); Zhen Wang, Xi'an Shaanxi Province (CN); Zhe Xu, Xi'an Shaanxi Province (CN)

(73) Assignee: Intel Deutschland GmbH, Neubiberg (DE)

( * ) Notice: Subject to any disclaimer, the term of this patent is extended or adjusted under 35 U.S.C. 154(b) by 0 days.

(21) Appl. No.: 14/233,352

(22) PCT Filed: Jun. 28, 2012

(86) PCT No.: PCT/CN2012/000886
§ 371 (c)(1),
(2), (4) Date: Dec. 19, 2014

(87) PCT Pub. No.: WO2014/000122
PCT Pub. Date: Jan. 3, 2014

(65) Prior Publication Data
US 2016/0142064 A1    May 19, 2016

(51) Int. Cl.
*H03L 7/099* (2006.01)
*H04L 27/00* (2006.01)
*H04L 27/26* (2006.01)
*H04B 17/20* (2015.01)
*H03J 7/04* (2006.01)
*H04L 25/49* (2006.01)

(52) U.S. Cl.
CPC ............... *H03L 7/099* (2013.01); *H03J 7/04* (2013.01); *H04B 17/20* (2015.01); *H04L 27/0014* (2013.01); *H04L 27/2672* (2013.01); *H04L 25/4902* (2013.01); *H04L 2027/0055* (2013.01); *H04L 2027/0073* (2013.01); *H04L 2027/0095* (2013.01)

(58) Field of Classification Search
CPC ....... H03L 7/06; H03L 7/099; H04L 27/0014; H04L 2027/0016; H04L 2027/0024; H04L 2027/0026; H04L 2027/0044; H04L 27/2657; H04L 27/2659; H04L 27/266; H04L 27/2672; H04B 17/20; H03J 7/04
USPC ........... 375/326, 344; 455/192.1, 192.2, 255, 455/257, 258, 259, 182.1, 182.2
See application file for complete search history.

(56) References Cited

U.S. PATENT DOCUMENTS

| | | | | |
|---|---|---|---|---|
| 8,081,939 B2* | 12/2011 | Bouyaud | ................ | H04B 1/712 375/345 |
| 2006/0245522 A1* | 11/2006 | Astrachan | ........... | H04L 27/2657 375/326 |
| 2008/0107098 A1* | 5/2008 | Spencer | ............... | H04B 7/2656 370/347 |

(Continued)

Primary Examiner — Betsy Deppe
(74) Attorney, Agent, or Firm — Schwegman Lundberg & Woessner, P.A.

(57) ABSTRACT

An automatic frequency control device, a method for automatic frequency control, a receiver, a mobile station and a non-transitory computer-readable digital storage medium are provided. The automatic frequency control device may include a quality calculation unit to calculate quality of a received signal, a state machine controller to generate a control signal based on the calculated quality of the received signal, and a filter to filter an estimated frequency offset of the received signal based on the control signal.

16 Claims, 4 Drawing Sheets

(56) References Cited

U.S. PATENT DOCUMENTS

2010/0222019 A1* 9/2010 Raza .................... H04B 17/336
455/264

* cited by examiner

AUTOMATIC FREQUENCY CONTROL

BACKGROUND

In a wireless communication system, it is required to synchronize a frequency of a Mobile Station (MS) with a frequency of a Base Station (BS). However, there is generally a frequency offset of the MS with respect to the BS due to oscillator drift of the MS, movement of the MS, etc. Therefore, Automatic Frequency Control (AFC), which automatically keeps a receiver of the MS tuned to a frequency of a received radio signal, is necessary in the receiver of the MS.

In general, a local oscillator of the MS is directly adjusted according to a result of a frequency offset estimation in the AFC. However, there will be a large error in the result of the frequency offset estimation in some extremely critical channel conditions, which may cause the local oscillator to drift away.

BRIEF DESCRIPTION OF THE DRAWINGS

Aspects of the present disclosure will be understood more fully from the detailed description given below and from the accompanying drawings of various examples of the invention, which, however, should not be taken to limit the invention to the specific examples, but are for explanation and understanding only.

DETAILED DESCRIPTION

In the following description, numerous details are set forth to provide a more thorough explanation of examples of the present invention. It will be apparent, however, to one skilled in the art, that examples of the present invention may be practiced without these specific details. In other instances, well-known structures and devices are shown in block diagram form, rather than in detail, in order to avoid obscuring examples of the present invention.

Throughout the description and claims, the terminology "mobile station" or "MS" includes, but is not limited to, a mobile station, a mobile subscriber unit, a mobile TV client, a pager, a cellular telephone, a Personal Digital Assistant (PDA), a smart phone, a text messaging device, a network interface card, a notebook computer, or any other type of mobile device capable of operating in a wireless environment.

Figure 1:
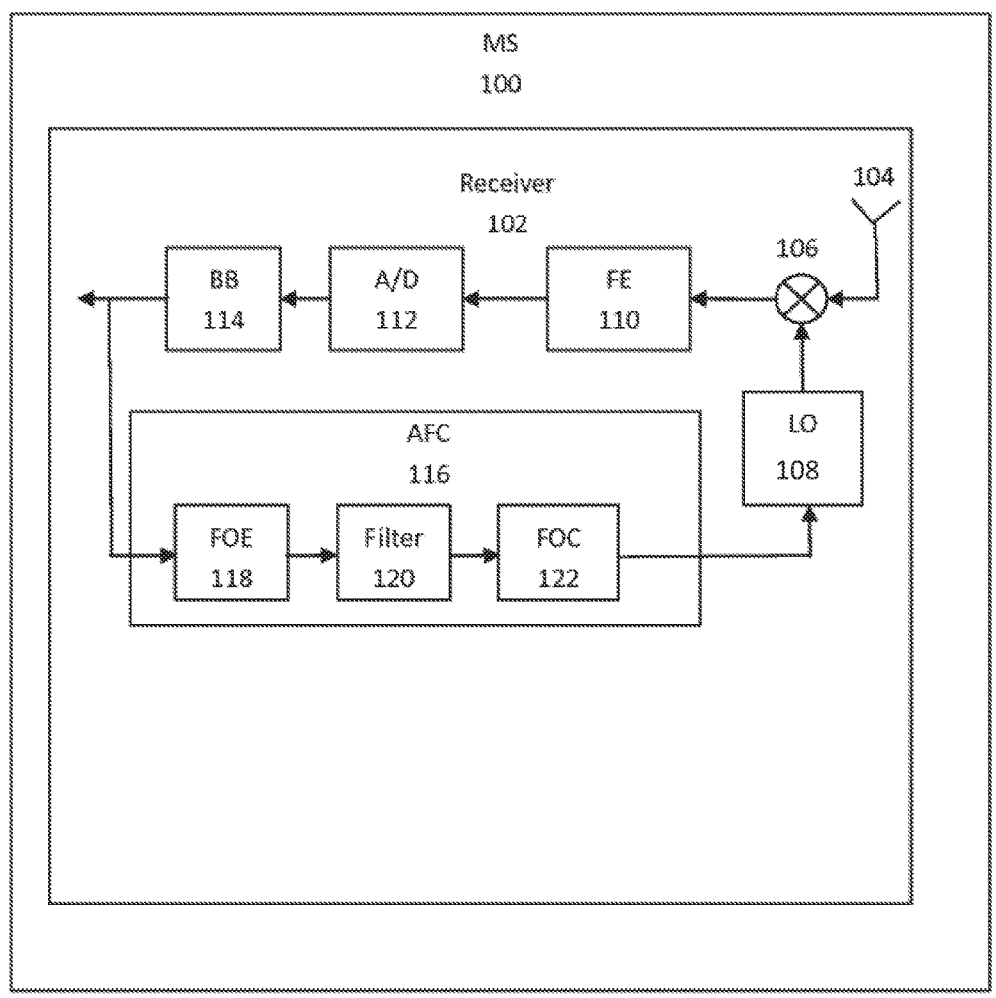
FIG. 1 is a schematic block diagram of an example of an MS.

FIG. 1 is a schematic block diagram of an example of an MS 100. The MS 100 comprises a receiver 102 which comprises an antenna 104, a frequency mixer 106, a local oscillator (LO) 108, an analog front end (FE) 110, an analog-to-digital converter (A/D) 112 and a digital baseband processing unit (BB) 114.

The antenna 104 receives a radio signal. The received signal is mixed in the frequency mixer 106 with an oscillator signal from the local oscillator 108. The mixed signal is processed by the analog front end 110 and then converted by the analog-to-digital converter 112 to a digital signal. The digital signal is processed by the digital baseband processing unit 114 into a digital baseband signal.

The receiver 102 further comprises an AFC device 116 which comprises a Frequency Offset Estimator (FOE) 118, a filter 120, and a Frequency Offset Compensator (FOC) 122.

The FOE 118 receives the digital baseband signal from the digital baseband processing unit 114 and estimates a frequency offset of the received signal by using a hard decoded base of the received signal.

According to an example, the FOE 118 may use a phase difference between consecutive symbols in the received signal to calculate the frequency offset. The phase difference may be calculated based on a known training sequence or decoded bits. For each burst of GSM (i.e. abbreviation for Global System for Mobile communications) communication, for example, there is a Training Sequence Code (TSC) transmitted which is known to the MS 100. When a call is set up via a BS (not shown), the BS will inform the MS 100 of the number of TSC. From the number of TSC, the MS 100 knows all the 26 symbols of the corresponding TSC. More information regarding the TSC may be found by referring to 3GPP TS 45.002 v10.3.0 (2012-03).

The filter 120 filters the estimated frequency offset from the FOE 118 by averaging the estimated frequency offset to get the average frequency offset estimation, which will make the AFC more stable. According to an example, the filter 120 may be an Infinite Impulse Response (IIR) filter. However, other kinds of filter may be used as well.

The FOC 122 receives the filtered estimated frequency offset and, based on it, generates a compensation signal to control the local oscillator 108 so as to compensate for the frequency offset. According to an example, the FOC 122 may, based on the filtered estimated frequency offset from filter 120, generate a Pulse Width Modulation (PWM) signal to control a voltage of the local oscillator 108 if the local oscillator 108 is a Voltage-Controlled Oscillator (VCO).

A loop in which the AFC device 116 is located will work well if the estimation result from the FOE 118 is stable.

However, the estimation result from the FOE 118 may become unstable in some extremely critical channel conditions. Examples of the critical channel conditions include, but are not limited to, the MS 100 in deep fading, the MS 100 moving at a large velocity, the MS 100 suffering from a strong noise or interference, etc. Consequently, the frequency offset may become larger. Then the larger frequency offset may result in a larger error of the frequency offset estimation, which may eventually cause the loop to crash.

Figure 2:
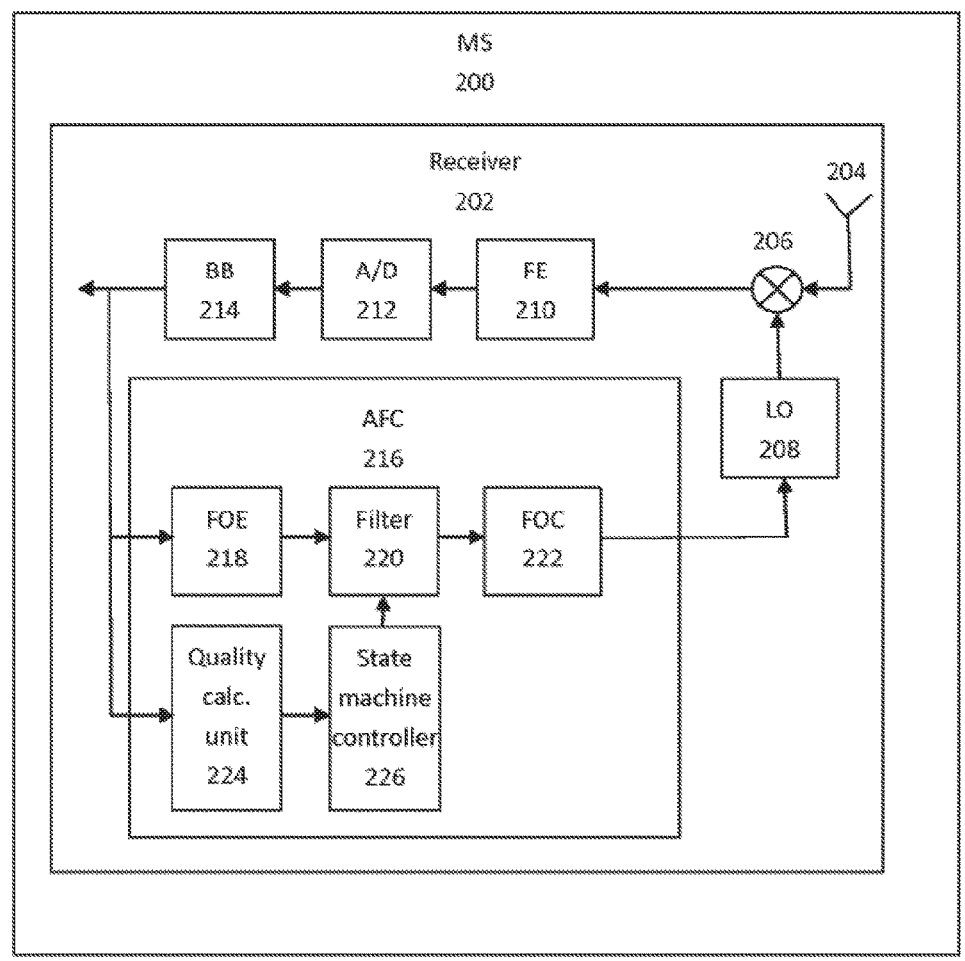
FIG. 2 is a schematic block diagram of another example of an MS.

To this end, a state machine is introduced to improve performance of the AFC shown in FIG. 1. With reference to FIG. 2, a schematic block diagram of another example of an MS 200 is shown.

The MS 200 comprises a receiver 202 which comprises an antenna 204, a frequency mixer 206, a local oscillator (LO) 208, an analog front end (FE) 210, an analog-to-digital converter (A/D) 212, and a digital baseband processing unit (BB) 214. These components are similar to those in FIG. 1 and hence are not described in detail herein.

The receiver 202 further comprises an AFC device 216 which comprises an FOE 218, a filter 220, an FOC 222, a quality calculation unit 224, and a state machine controller 226.

The FOE 218, similar to the FOE 118 of FIG. 1, receives a digital baseband signal from the digital baseband processing unit 214 and estimates a frequency offset of the received signal by using a hard decoded base of the received signal.

According to an example, the FOE 218 may use a phase difference between consecutive symbols in the received signal to calculate the frequency offset. The phase difference may be calculated based on known training sequence or decoded bits. For each burst of GSM communication, for example, there is a Training Sequence Code (TSC) transmitted which is known to the MS 200. When a call is set up via a BS (not shown), the BS will inform the MS 100 of the number of TSC. From the number of TSC, the MS 100 knows all the 26 symbols of the corresponding TSC. More information regarding the TSC may be found by referring to 3GPP TS 45.002 v10.3.0 (2012-03).

The quality calculation unit 224 receives also the digital baseband signal from the digital baseband processing unit 214 and calculates quality of the received signal. The quality of the received signal may be represented by a parameter qual. A larger value of the parameter qual means better quality of decoded bits in the received signal.

According to an example, for a burst comprising a plurality of bits, the parameter qual is calculated as a sum of absolute values of soft decisions of all the bits in the plurality of bits where each bit corresponds to an absolute value of a soft decision. The soft decision of a bit is generally an integer, which is a measure of how likely it is that the bit is a 0 or 1. As opposed to a hard decision only considering a polarity of a received bit, the soft decision considers both the polarity of and a reliability of the received bit. In an example, 5 bits are used to represent a soft decision of a received bit such that a value of the soft decision ranges from −15 to 15. A value of −15 means the received bit should be 0 with the largest probability, and a value of 15 means the received bit should be 1 with the largest probability.

According to an example, for an exemplary GSM communication, there are 116 bits of payload in one burst. Since a maximum absolute value of a soft decision is 15 for each bit, a maximum value for the parameter qual may be 15*116=1740.

According to an example, since the parameter qual is calculated burst by burst, it may be averaged over a time period to make the calculation result more stable. Assuming m is a length for averaging, the averaged parameter qual is denoted as mean_qual:

$$\text{mean\_qual}(n) = \begin{cases} \frac{1}{n+1}\sum_{k=0}^{n} qual(k) & n < m \\ \frac{1}{m}\sum_{k=n-m+1}^{n} qual(k) & n \geq m \end{cases} \quad (1)$$

where n represents the number of bursts, and qual(k) represents the quality of the $k^{th}$ burst.

The state machine controller 226 generates a control signal based on the calculated quality of the received signal from the quality calculation unit 224 so as to control the filter 220. According to an example, the control signal may be a state of a state machine used in the state machine controller 226 of FIG. 2.

The filter 220 filters the estimated frequency offset from the FOE 218 based on the control signal from the state machine controller 226. According to an example, different scaling factors and/or different forgetting factors are selected for the filter 220 based on the state of the state machine so as to make the AFC loop more stable, as will be described in detail in conjunction with FIG. 3. The filter 220 may be an IIR filter, for example. However, other kinds of filter may be used as well.

The FOC 222, similar to the FOC 122 of FIG. 1, receives the filtered estimated frequency offset and, based on it, generates a compensation signal to control the local oscillator 208 so as to compensate for the frequency offset. According to an example, the FOC 222 may, based on the filtered estimated frequency offset, generate a PWM signal to control a voltage of the local oscillator 208 if the local oscillator 208 is a VCO.

A detailed description of an example of a state machine used in the state machine controller 226 of FIG. 2 is given below in conjunction with FIG. 3.

Figure 3:
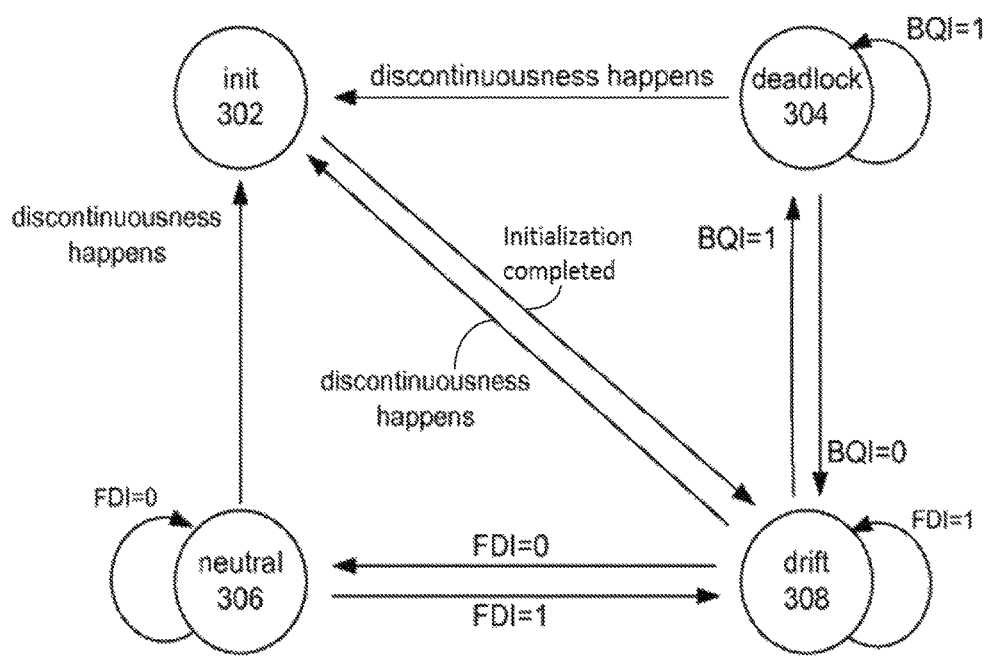
FIG. 3 schematically shows an example of a state machine for use in the MS shown in FIG. 2.

There are four states in the state machine of FIG. 3, that is, an initialization state 302, a deadlock state 304, a neutral state 306, and a drift state 308. State transitions in the state machine may be triggered mainly by a Frequency Drift Indicator (FDI) and a Bad Quality Indicator (BQI).

The FDI may indicate whether frequency offset compensation is insufficient. In other words, the FDI may indicate whether residue frequency offset is large. The FDI may relate to Cyclic Redundancy Check (CRC) of the decoded bits, the received signal quality, or the frequency offset estimation quality, etc.

The FDI may take one of two values: 1 and 0. For example, if the FDI indicates that the frequency offset compensation is insufficient, the FDI may take a value of 1. Otherwise if the frequency offset compensation is sufficient, the FDI may take a value of 0.

The BQI may indicate whether compensated signal quality is bad or not. The BQI may take one of two values: 1 and 0. For example, if the BQI indicates that the compensated signal quality is bad, the BQI may take a value of 1. Otherwise if the compensated signal quality is not bad, the BQI may take a value of 0.

In the state machine of FIG. 3, the state machine enters the initialization state 302 whenever a change in a traffic state of the MS 200 happens, such as a handover, a call setup, etc.

When the state machine is in the initialization state 302, the state machine controller 226 resets all registers or calculation results relating to the AFC loop in the state machine. Since all internal states and calculation results are reset in the initialization state 302, selection of the scaling factor and the forgetting factor for the filter 220 doesn't matter. After initialization is complete, the state machine enters the drift state 308 automatically. The reason for the state machine to enter the drift state 308 automatically is mainly a quick temperature change due to a setup of a call or a release of a call.

When the state machine is in the drift state 308, the AFC device 216 estimates the frequency offset, and make the compensation fast since the AFC device 216 knows there is a frequency drift to be compensated. According to an example, when the state machine is in the drift state 308, a large scaling factor and a large forgetting factor are selected for the filter 220 to make an output of the filter response fast enough so that the frequency drift can be tracked.

If the FDI indicates that the frequency offset compensation is insufficient or the residual frequency offset is large (for example, FDI=1), the state machine will stay in the drift state 308. If the FDI indicates that the frequency offset compensation is not insufficient or the residual frequency offset is not large (for example, FDI=0), the state machine will shift to the neutral state 306. If the BQI indicates that the compensated signal quality is bad (for example, BQI=1), which may be a consequence of the AFC loop crash or malfunction of the AFC loop, the state machine will shift to the deadlock state 304.

When the state machine is in the neutral state 306, the AFC device 216 estimates the frequency offset, and make the compensation slowly since the frequency offset is rather small and stable. According to an example, when the state machine is in the neutral state 306, a small scaling factor and a small forgetting factor are selected for the filter 220 to make the output of the filter response more stable.

If the FDI indicates that the frequency offset compensation is not insufficient or the residual frequency offset is not large (for example, FDI=0), the state machine will stay in the neutral state 306. If the FDI indicates that the frequency offset compensation is insufficient or the residual frequency offset is large (for example, FDI=1), the state machine will shift to the drift state 308.

When the state machine is in the deadlock state 304, the AFC device 216 estimates the frequency offset and make the compensation in a way similar to that in the drift state 308 and the neutral state 306, which may be regarded as a fine compensation. According to an example, when the state machine is in the deadlock state 304, a moderate scaling factor and a moderate forgetting factor are selected for the filter 220. Said moderate scaling factor is between the scaling factors selected in the neutral state 306 and in the drift state 308. Said moderate forgetting factor is between the forgetting factors selected in the neutral state 306 and in the drift state 308.

Meanwhile, the AFC device 216 compensates for the frequency offset in a different way compared with the other states. For example, the FOE 218 may take a temperature measurement from a temperature sensor in the MS 200 as an input, and get a coarse frequency offset due to a temperature change based on a pre-measured table. The coarse frequency offset may be used by the FOC 222 to make the compensation, which may be regarded as a coarse compensation. The fine compensation and the coarse compensation can collectively improve frequency offset compensation performance when the state machine is in the deadlock state 304.

If the BQI indicates that the compensated signal quality is bad (for example, BQI=1), the state machine will stay in the deadlock state 304. If the BQI indicates that the compensated signal quality is not bad (for example, BQI=0), the state machine will shift to the drift state 308.

According to an example, two thresholds for the state transitions, $THR_{drift}$ and $THR_{neutral}$, are predefined.

If mean_qual≥$THR_{neutral}$, this case may be regarded as FDI=0.

If $THR_{drift}$<mean_qual<$THR_{neutral}$, this case may be regarded as FDI=1.

If mean_qual≤$THR_{drift}$, this case may be regarded as BQI=1, otherwise BQI=0.

To make the frequency offset compensation with different levels in different states, a set of scaling factors [$\alpha_1$, $\alpha_2$, $\alpha_3$] are predefined. The state machine of FIG. 3 will work with the rules below:

1) when the state machine is in the neutral state 306 and mean_qual≥$THR_{neutral}$, the estimated frequency offset will be scaled by $\alpha_1$;

2) when the state machine is in the drift state 308 and $THR_{drift}$<mean_qual<$THR_{neutral}$, the estimated frequency offset will be scaled by $\alpha_2$; and 3) when the state machine is in the deadlock state 304 and mean_qual≤$THR_{drift}$, the estimated frequency offset will be scaled by $\alpha_3$, and the temperature based compensation will be activated.

In general, $\alpha_2 > \alpha_3 > \alpha_1$.

According to an example, $\alpha_1$ may be $\frac{1}{16}$. $\alpha_2$ may be $\frac{1}{4}$ meaning fast adaptation of the AFC control loop. $\alpha_3$ may be $\frac{1}{8}$ meaning a stable adjustment since the temperature based compensation is less accurate. Moreover, $\alpha_3$ will make sure that the state machine can leave the deadlock state 304 as soon as possible.

In the AFC shown in FIG. 2, not only the result of the frequency offset estimation but also the FDI and BQI are taken into account through use of the state machine shown in FIG. 3. Therefore, the AFC of FIG. 2 may work in a stable manner even if some extremely critical channel conditions occur. Examples of the critical channel conditions include, but are not limited to, the MS 200 in deep fading, the MS 200 moving at a large velocity, the MS 200 suffering from a strong noise or interference, etc. Hence, the AFC loop crash or malfunction of the AFC loop may be avoided.

Figure 4:
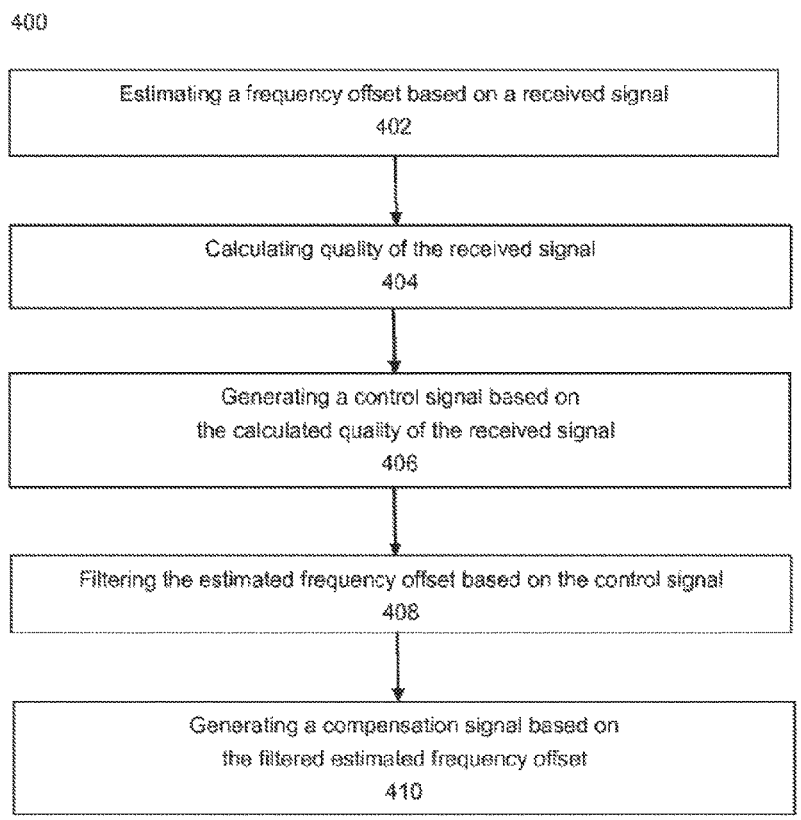
FIG. 4 schematically shows a flow chart of an example of a method for AFC.

Referring to FIG. 4, a flow chart of an example of a method 400 for AFC is shown. The method 400 may be performed by the AFC 216 shown in FIG. 2. The method 400 may comprise estimating a frequency offset of a received signal in step 402, which may be performed by the FOE 218. The method 400 may further comprise calculating quality of the received signal in step 404, which may be performed by the quality calculation unit 224. The method 400 may further comprise generating a control signal based on the calculated quality of the received signal in step 406, which may be performed by the state machine controller 226. The method 400 may further comprise filtering the estimated frequency offset based on the control signal in step 408, which may be performed by the filter 220. The method 400 may further comprise generating a compensation signal based on the filtered estimated frequency offset in step 410, which may be performed by the FOC 222. Through use of the method 400, the AFC may work in a stable manner even if some extremely critical channel conditions occur. Hence, the AFC loop crash or malfunction of the AFC loop may be avoided.

The automatic frequency control disclosed herein may be applied to a wide variety of wireless communication technologies and standards, including, but not limited to, third generation (3G) mobile telecommunications standards, Long Term Evolution (LTE) standards, fourth generation (4G) mobile telecommunications standards, etc. Examples of 3G mobile telecommunications standards include Wideband Code Division Multiple Access (WCDMA), Code Division Multiple Access 2000 (CDMA2000), Time Division-Synchronous Code Division Multiple Access (TD-SCDMA), Worldwide Interoperability for Microwave Access (WiMax), and the like.

The teachings disclosed herein may also be applied to a non-transitory computer-readable digital storage medium having stored thereon a computer program having a program code for performing a method for AFC. The method comprises estimating a frequency offset of a received signal, calculating quality of the received signal, generating a control signal based on the calculated quality of the received signal, filtering the estimated frequency offset based on the control signal, and generating a compensation signal based on the filtered estimated frequency offset.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some examples, some one or more of the most important method steps may be executed by such an apparatus.

Depending on certain implementation requirements, examples of the disclosure can be implemented in hardware or in software or in firmware or in any combination thereof. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

In some examples, a programmable logic device (for example a field programmable gate array) may be used to perform some or all of the functionalities of the methods described herein. In some examples, a field programmable gate array may cooperate with a microprocessor in order to perform one of the methods described herein. Generally, the methods are preferably performed by any hardware apparatus.

Throughout the description and claims, the words "comprise", "include", and variations of the words, for example "comprising" and "comprises", means "including but not limited to", and is not intended to (and does not) exclude other components, integers or steps.

Throughout the description and claims, the singular encompasses the plural unless the context otherwise requires. In particular, where the indefinite article is used, the specification is to be understood as contemplating plurality as well as singularity, unless the context requires otherwise.

The above described examples are merely illustrative for the principles of the present invention. It is understood that modifications and variations of the examples and the details described herein will be apparent to others skilled in the art. It is the intent, therefore, to be limited only by the scope of the impending patent claims and not by the specific details presented by way of description and explanation of the examples herein.

What is claimed is:

1. An automatic frequency control device, comprising:
    a frequency offset estimator (FOE) configured to receive a digital baseband signal indicative of a received wireless signal and to estimate a frequency offset of the received wireless signal using phase differences between consecutive symbols of the digital baseband signal;
    a quality calculation circuit configured to sum a plurality of absolute values to provide a quality of the received wireless signal, wherein each absolute value of the plurality of absolute values corresponds to a bit within the received wireless signal;
    a state machine controller to generate a control signal based on the quality of the received wireless signal; and
    a filter configured to receive the estimated frequency offset and the control signal and to provide a filtered estimated frequency offset of the received wireless signal.

2. The automatic frequency control device according to claim 1, further comprising:
    a frequency offset compensator (FOC) to generate a compensation signal based on the filtered estimated frequency offset.

3. The automatic frequency control device according to claim 2, wherein the FOC controls a local oscillator using the compensation signal.

4. The automatic frequency control device according to claim 1, wherein the quality calculation unit is configured to provide the quality of the received wireless signal burst by burst.

5. The automatic frequency control device according to claim 4, wherein each absolute value of the plurality of absolute values corresponds to a soft decision about a value of each bit within a burst of the wireless signal.

6. The automatic frequency control device according to claim 4, wherein the quality calculation unit is configured to provide a burst by burst quality average using the sum of absolute values for each burst over a time period.

7. The automatic frequency control device according to claim 1, wherein the state machine controller uses a state machine comprising an initialization state, a deadlock state, a neutral state, and a drift state.

8. The automatic frequency control device according to claim 7, wherein state transitions in the state machine occur in response to a frequency drift indicator and a bad quality indicator, wherein the frequency drift indicator indicates whether frequency offset compensation is insufficient, and wherein the bad quality indicator indicates whether compensated signal quality is bad.

9. The automatic frequency control device according to claim 8, wherein, when the state machine is in the neutral state and the quality of the received wireless signal is larger than or equal to a first threshold, the filter is configured to scale the estimated frequency offset by a first scaling factor $\alpha_1$ based on the control signal;
    wherein, when the state machine is in the drift state and the quality of the received wireless signal is smaller than the first threshold and larger than a second threshold, the filter is configured to scale the estimated frequency offset by a second scaling factor $\alpha_2$ based on the control signal; and
    wherein, when the state machine is in the deadlock state and the quality of the received wireless signal is smaller than or equal to the second threshold, the filter is configured to scale the estimated frequency offset by a third scaling factor $\alpha_3$ based on the control signal.

10. A method of automatic frequency control, comprising:
    receiving a digital baseband signal indicative of a received wireless signal at a frequency offset estimator (FOE);
    estimating a frequency offset of the received signal using phase differences between consecutive symbols of the digital baseband signal;
    generating an absolute value associated with a soft decision about a value of each bit of a plurality of bits of the received wireless signal to provide a plurality of absolute values;
    summing the plurality of absolute values to provide a quality of the received wireless signal;
    generating a control signal based on the quality of the received wireless signal; and
    filtering the estimated frequency offset based on the control signal to provide a filtered estimated frequency offset.

11. The method according to claim 10, further comprising generating a compensation signal based on the filtered estimated frequency offset.

12. The method according to claim 11, further comprising controlling a local oscillator using the compensation signal.

13. The method according to claim 10, wherein summing the plurality of absolute values to provide a quality of a received wireless signal comprises summing the plurality of absolute values burst by burst.

14. The method according to claim 13, further comprising averaging the quality of the received wireless signal over a time period.

15. The method according to claim 10, wherein generating a control signal based on the quality of the received wireless signal comprises using a state machine comprising an initialization state, a deadlock state, a neutral state, and a drift state.

16. The method according to claim 15, further comprising triggering state transitions in the state machine based on a frequency drift indicator and a bad quality indicator, wherein the frequency drift indicator indicates whether frequency offset compensation is insufficient, and wherein the bad quality indicator indicates whether compensated signal quality is bad.

* * * * *